United States Patent
Wu

(10) Patent No.: US 7,932,749 B2
(45) Date of Patent: Apr. 26, 2011

(54) HYBRID DRIVING APPARATUS AND METHOD THEREOF

(75) Inventor: Chien-Ming Wu, Taoyuan County (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/540,871

(22) Filed: Aug. 13, 2009

(65) Prior Publication Data

US 2010/0039145 A1 Feb. 18, 2010

(30) Foreign Application Priority Data

Aug. 14, 2008 (TW) .............................. 97131043 A

(51) Int. Cl.
*H03K 19/0175* (2006.01)
(52) U.S. Cl. .......................................... 326/86; 326/83
(58) Field of Classification Search .............. 326/82–87, 326/89–91; 327/108, 109
See application file for complete search history.

(56) References Cited

U.S. PATENT DOCUMENTS

| 6,788,102 | B2 * | 9/2004 | Atyunin et al. ................. 326/30 |
| 7,119,611 | B2 | 10/2006 | Wyers et al. |
| 7,495,474 | B2 * | 2/2009 | Komatsu et al. ................ 326/82 |
| 7,671,630 | B2 * | 3/2010 | Howe et al. ..................... 326/82 |

* cited by examiner

*Primary Examiner* — James Cho
(74) *Attorney, Agent, or Firm* — Thomas, Kayden, Horstemeyer & Risley, LLP

(57) ABSTRACT

A hybrid driving apparatus and a method thereof are provided. The hybrid driving apparatus includes a first driving unit, a second driving unit, and a resistor. The first driving unit has a first output end. The second driving unit has a second output end coupled to a first bonding pad. The resistor is coupled between the first output end and the first bonding pad to serve as a matching impedance. When the driving apparatus operates in a first transmission mode, the first driving unit and the second driving unit jointly drive the first bonding pad. When the driving apparatus operates in a second transmission mode, the first driving unit and the second driving unit drive the first bonding pad and a second bonding pad respectively.

20 Claims, 2 Drawing Sheets

HYBRID DRIVING APPARATUS AND METHOD THEREOF

CROSS-REFERENCES TO RELATED APPLICATION

This non-provisional application claims priority under 35 U.S.C. §119(a) on Patent Application No(s). 97131043 filed in Taiwan, R.O.C. on Aug. 14, 2008, the entire contents of which are hereby incorporated by reference.

BACKGROUND

1. Technical Field

The disclosure relates to a driving apparatus and a method thereof, in particular, to a hybrid driving apparatus and a method thereof.

2. Related Art

Nowadays, in order to connect an integrated circuit to an external electronic product or the Internet, a driver (also referred to as a line driver), is provided at an output interface of the integrated circuit to drive an external load. Generally, the following aspects are taken into consideration in the design of a driver: 1, impedance matching; 2, power saving; 3, area saving; and 4, compliance with standards and specifications of driving signals output by the driver. Therefore, electronic circuit designers continuously make efforts to meet the above requirements.

In the prior art, in order to enable the driving signal output by the driver to comply with the standards and specifications, U.S. Pat. No. 7,119,611 provided a solution. In this patent, a variable current stage 514 is coupled to an output node 516 to control the amplitude of a driving signal $V_{out}$, so as to enable the driving signal to comply with the standards and specifications. However, as the variable current stage 514, an amplifier 502 and a series resistor 522 form a feedback path, an output impedance $R_{out}$ will be affected by the variable current stage 514. Therefore, an equivalent impedance of the variable current stage 514 needs to be calibrated by using additional calibration circuits (526 and 528), such that the output impedance $R_{out}$ matches the load impedance RL. As a result, the additional calibration circuits (526 and 528) will waste space and cause extra power consumption.

SUMMARY

Accordingly, the disclosure is directed to a hybrid driving apparatus and a method thereof. Through the hybrid driving apparatus and the method thereof of the disclosure, the effects of impedance matching and power saving are achieved, and the cost is saved as no additional calibration circuit in the prior art is needed. Moreover, a driving signal output by the hybrid driving apparatus of the disclosure complies with standards and specifications.

The disclosure provides a driving apparatus for driving a first bonding pad and a second bonding pad. The driving apparatus includes a first driving unit, a second driving unit, and a resistor. The first driving unit has a first output end. The second driving unit has a second output end coupled to the first bonding pad. The resistor is coupled between the first output end and the first bonding pad to serve as a matching impedance. When the driving apparatus operates in a first transmission mode, the first driving unit and the second driving unit jointly drive the first bonding pad. When the driving apparatus operates in a second transmission mode, the first driving unit and the second driving unit drive the first bonding pad and the second bonding pad respectively.

Moreover, the disclosure further provides a driving apparatus for outputting a driving signal to a first bonding pad. The driving apparatus includes a first driving unit, a second driving unit, and a resistor. The first driving unit has a first output end, and is used to generate a first driving voltage to the first output end. The second driving unit has a second output end coupled to the first bonding pad, and is used to output a first driving current to the second output end. The resistor is coupled between the first output end and the second output end to serve as a matching impedance. When the driving apparatus operates in a first transmission mode, the second driving unit outputs the first driving current to the first bonding pad, such the first driving current flows through the first bonding pad to output the driving signal. When the driving apparatus operates in a second transmission mode, the second driving unit stops outputting the first driving current to the first bonding pad such the first driving voltage outputs the driving signal through the resistor.

BRIEF DESCRIPTION OF THE DRAWINGS

The disclosure will become more fully understood from the detailed description given herein below for illustration only, and thus are not limitative of the disclosure invention, and wherein.

DETAILED DESCRIPTION

Figure 1:
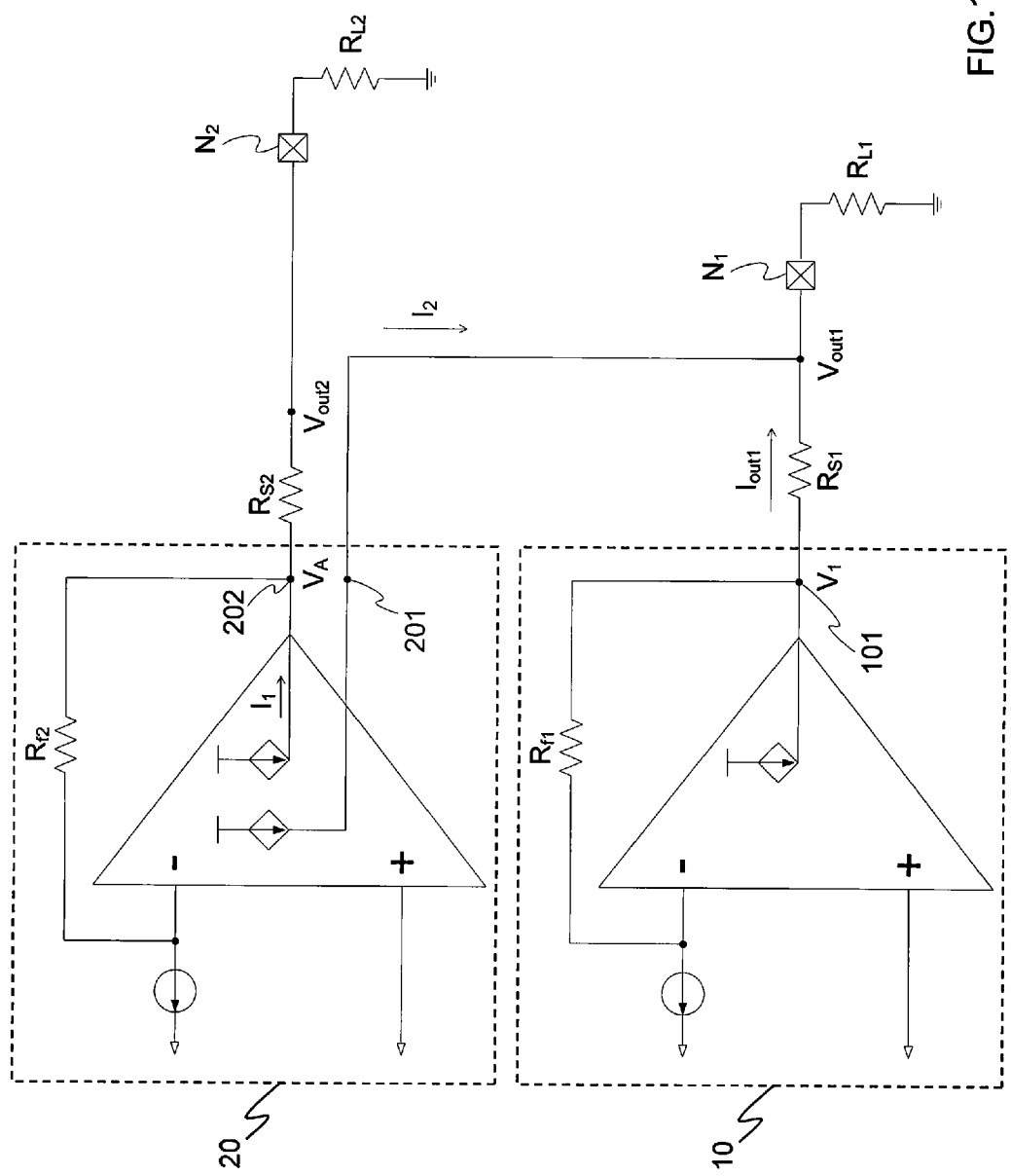
FIG. 1 is a schematic view of a driving apparatus according to a first embodiment of the disclosure.

FIG. 1 is a schematic view of a driving apparatus according to a first embodiment of the disclosure. Referring to FIG. 1, the driving apparatus includes an output resistor $R_{S1}$, a first driving unit 10, and a second driving unit 20. The coupling relation is as shown in FIG. 1. A first output end 101 of the first driving unit 10 is coupled to one end of the output resistor $R_{S1}$, and outputs a driving voltage $V_1$. The second driving unit 20 has a second output end 201, which is coupled to the other end of the output resistor $R_{S1}$ and a first bonding pad $N_1$. Moreover, the second driving unit 20 further has a third output end 202 coupled to a second bonding pad $N_2$.

For convenience of illustration, it is assumed that the driving apparatus of the disclosure is disposed in a Gigabit Ethernet chip, and has multiple transmission modes, such as 10 Mbps, 100 Mbps, 1000 Mbps and 10 Gbps transmission modes. Further, it is assumed that the resistance of the output resistor $R_{S1}$, an output resistor $R_{S2}$, a load resistor $R_{L1}$, and a load resistor $R_{L2}$ is 50 ohms. It should be noted that, the driving apparatus of the disclosure is not limited to the application in the Ethernet chip, but is also applicable to other transmission interfaces.

When the driving apparatus operates in 10 Mbps transmission mode, the first driving unit 10 outputs a driving voltage $V_1$ to the first output end 101, and the second driving unit 20 outputs a driving current $I_2$ to the first bonding pad $N_1$. At this time, the first driving unit 10 and the second driving unit 20 jointly output a driving signal $V_{out1}$ to the first bonding pad $N_1$ and the load resistor $R_{L1}$. In other words, 10 Mbps transmission mode is a hybrid transmission mode, that is, the first driving unit 10 uses a voltage mode to provide the driving voltage $V_1$, and the second driving unit 20 uses a current mode to provide the driving current $I_2$, so as to jointly drive the first bonding pad $N_1$ and the load resistor $R_{L1}$. The second driving unit 20 assists in outputting the driving current $I_2$ to the first bonding pad $N_1$ and the magnitude of the driving current $I_2$ may be appropriately designed, such that the driving signal $V_{out1}$ is substantially equal to the driving voltage $V_1$. Thus, a current $I_{out1}$ flowing through the output resistor $R_{S1}$ is very small in fact, such that the effect of low power consumption is achieved, and the driving signal complies with the standards and specifications. Moreover, as the second bonding pad $N_2$ does not need to output the driving signal when the driving apparatus operates in 10 Mbps transmission mode, the second driving unit 20 will disable the output of a driving current $I_1$ to the second bonding pad $N_2$.

Then, when the driving apparatus operates in 100 Mbps transmission mode, the first driving unit 10 outputs the driving voltage $V_1$ to the first output end 101, and the second driving unit 20 stops outputting the driving current $I_2$ to the first bonding pad $N_1$. At this time, the first driving unit 10 provides the driving voltage $V_1$ in the voltage mode, and outputs the driving signal $V_{out1}$ to the first bonding pad $N_1$ through the output resistor $R_{S1}$. As the second driving unit 20 stops outputting the driving current $I_2$ to the first bonding pad $N_1$, and the resistance of the output resistor $R_{S1}$ and the load resistor $R_{L1}$ is both 50 ohms, the driving signal $V_{out1}$ is substantially equal to ½ of the driving voltage $V_1$.

Then, when the driving apparatus operates in 1000 Mbps transmission mode, the first driving unit 10 outputs the driving voltage $V_1$ to the first output end 101, and the second driving unit 20 outputs the driving current $I_1$ to the third output end 202 so as to generate a driving voltage $V_A$. The driving voltage $V_A$ then outputs a driving signal $V_{out2}$ to the second bonding pad $N_2$ through the output resistor $R_{S2}$. It should be noted that in 1000 Mbps transmission mode the second driving unit 20 also stops outputting the driving current $I_2$ to the first bonding pad $N_1$.

It is known from the above illustration that when the driving apparatus of the disclosure operates in 10 Mbps transmission mode the first driving unit 10 and the second driving unit 20 jointly drive the first bonding pad $N_1$; in 100 Mbps transmission mode, the first driving unit 10 independently drives the first bonding pad $N_1$, and the second driving unit 20 does not output the driving signal to the second bonding pad $N_2$; and in 1000 Mbps transmission mode, the first driving unit 10 and the second driving unit 20 drive the first bonding pad $N_1$ and the second bonding pad $N_2$ respectively.

Moreover, as shown in FIG. 1, the second driving unit 20 includes two output stages: one for outputting the driving current $I_1$, and the other for outputting the driving current $I_2$; and the driving current $I_1$ is in proportion to the driving current $I_2$. The driving current $I_2$ output by the second driving unit 20 flows to the first bonding pad $N_1$ to generate the driving signal $V_{out1}$. Therefore, in the disclosure, the driving current $I_2$ is accurately controlled by utilizing the proportional relation between the output stages of the second driving unit 20, thus controlling the driving signal $V_{out1}$. A detailed illustration will be given below.

Figure 2:
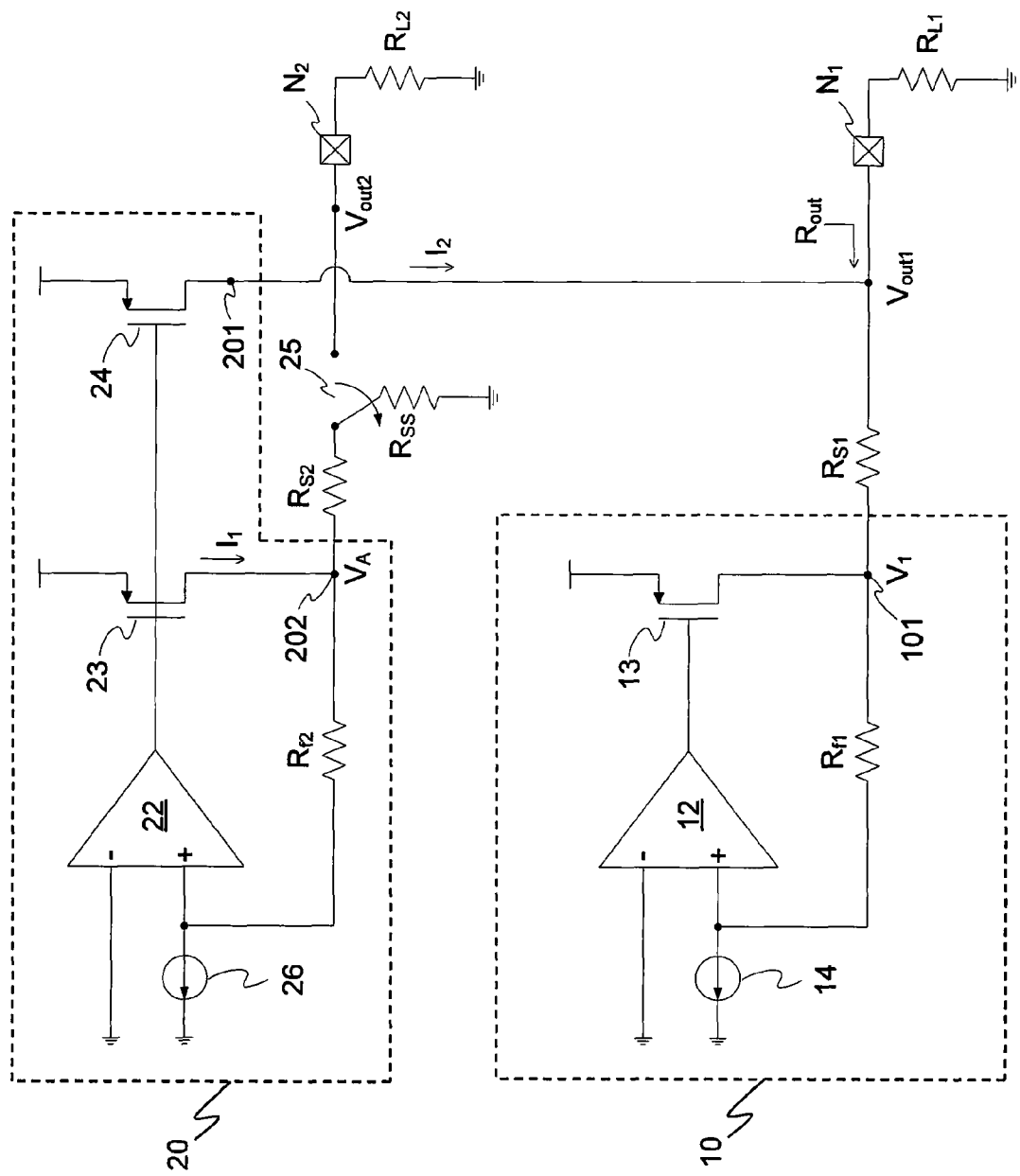
FIG. 2 is a schematic view of a driving apparatus according to a second embodiment of the disclosure.

FIG. 2 is a schematic view of a driving apparatus according to a second embodiment of the disclosure. In the second embodiment, elements included in the first driving unit 10 and the second driving unit 20 are described in more detail.

The first driving unit 10 includes a feedback resistor $R_{f1}$, a first operational amplifier 12, and a first transistor 13. The first operational amplifier 12 has at least an input end and an output end, and the input end is coupled to a current source 14. The first transistor 13 serves as an output stage of the first driving unit 10, and has a gate coupled to the output end of the first operational amplifier 12, and a drain coupled to the input end of the first operational amplifier 12 via the feedback resistor $R_{f1}$. Therefore, the first operational amplifier 12, the first transistor 13, and the feedback resistor $R_{f1}$ form a feedback path, and the impedance thereof is almost zero when viewed from an endpoint 101. Hence, an output impedance $R_{out}$ of the entire driving apparatus, i.e., the impedance when viewed from the first bonding pad $N_1$, is just the impedance of an output resistor $R_{S1}$, which is expressed by a mathematical expression $R_{out}=R_{S1}$.

The second driving unit 20 includes a feedback resistor $R_{f2}$, a second operational amplifier 22, a second transistor 23, and a third transistor 24. The second operational amplifier 22 has at least an input end and an output end, and the input end is coupled to a current source 26. The second transistor 23 has a gate coupled to the output end of the second operational amplifier 22, and a drain coupled to the input end of the second operational amplifier 22 via the feedback resistor $R_{f2}$, and the driving voltage $V_A$ is generated at the coupling position between the second transistor 23 and the feedback resistor $R_{f2}$. As described above, the second driving unit 20 has the same structure as the first driving unit 10. The first driving unit 10 and the second driving unit 20 were originally driving units independent from each other in nature, but in the disclosure, an originally independent driving unit is used to assist another driving unit so as to form a hybrid driving apparatus.

The second driving unit 20 further includes a third transistor 24. The third transistor 24 has a gate coupled to the output end of the second operational amplifier 22, and a drain coupled to the first bonding pad $N_1$. An output of the second transistor 23 is in proportion to that of the third transistor 24, for example, 1: K, where K may be any number.

Moreover, the second driving unit 20 further includes a switching unit 25 and an auxiliary resistor $R_{SS}$. The switching unit 25 is coupled to the output resistor $R_{S2}$ to control an operation mode of the second driving unit 20. When the driving apparatus operates in 10 Mbps transmission mode, the switching unit 25 couples the output resistor $R_{S2}$ to the auxiliary resistor $R_{SS}$, such that the second driving unit 20 assists in outputting the driving current $I_2$ via the third transistor 24; when the driving apparatus operates in 1000 Mbps transmission mode, the switching unit 25 couples the output resistor $R_{S2}$ to the second bonding pad $N_2$, such that the second driving unit 20 outputs the driving signal $V_{out2}$ to the second bonding pad $N_2$. According to an embodiment of the disclosure, an impedance of the auxiliary resistor $R_{SS}$ is designed to be greater than that of the output resistor $R_{S1}$ or the output resistor $R_{S2}$.

It is known from the embodiment shown by FIG. 2 that, the power consumption of the driving apparatus can be greatly reduced through appropriate design of the aspect ratios of the auxiliary resistor $R_{SS}$, the second transistor 23, and the third transistor 24. For example, when the driving current $I_2$ is designed such that the driving signal $V_{out1}$ is substantially equal to the driving voltage $V_1$, the current $I_{out1}$ flowing through the output resistor $R_{S1}$ will be zero. Thus, no power will be consumed by the output resistor $R_{S1}$. However, in fact, it is not necessary to adjust the driving signal $V_{out1}$, to be equal to the driving voltage $V_1$. Instead, the driving current $I_2$ may be adjusted such that a voltage difference between the driving signal $V_{out1}$ and the driving voltage $V_1$ is smaller than a preset value (the smaller the voltage difference is, the less power will be consumed by the output resistor $R_{S1}$). The driving apparatus of the disclosure can realize less power consumption than the driving apparatus in the prior art, as long as the voltage difference is smaller than the preset value. Thus, the effect of power saving is achieved.

The driving apparatus of the disclosure is applicable to a Gigabit Ethernet chip. As the Gigabit Ethernet includes four pairs of output lines, in which only two pairs are used in 10 Mbps and 100 Mbps modes, any of the two pairs may be driven by the first driving unit 10, and any of the other two pairs of output lines that are not used may be driven by the second driving unit 20. Thus, in 10 Mbps transmission mode, the unused second driving unit 20 may be used to assist in driving the first bonding pad $N_1$, so the effect of power saving can be achieved without occupying any additional configuration area. If the Gigabit Ethernet operates in 1000 Mbps mode (all the four pairs of output lines need to be concurrently used), normal transmission can be achieved by simply switching the switching unit 25 to the second bonding pad $N_2$ and then disabling the third transistor 24.

While the present invention has been described by the way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements

What is claimed is:

1. A driving apparatus, comprising:
   a first driving unit, having a first output end;
   a second driving unit, having a second output end; and
   a resistor, coupled between the first output end and a first bonding pad;
   wherein when the driving apparatus operates in a first transmission mode, the first driving unit and the second driving unit jointly drive a first signal to the first bonding pad; and when the driving apparatus operates in a second transmission mode, the first driving unit and the second driving unit drive a second signal and a third signal to the first bonding pad and a second bonding pad respectively.

2. The driving apparatus according to claim 1, wherein the first driving unit comprises:
   a first feedback resistor;
   a first operational amplifier, having at least an input end and an output end; and
   a first transistor, having a gate coupled to the output end of the first operational amplifier, and a drain coupled to the first output end and coupled to the input end of the first operational amplifier via the first feedback resistor.

3. The driving apparatus according to claim 2, wherein the second driving unit comprises:
   a second feedback resistor;
   a second operational amplifier, having at least an input end and an output end;
   a second transistor, having a gate coupled to the output end of the second operational amplifier, and a drain coupled to the input end of the second operational amplifier via the second feedback resistor; and
   a third transistor, having a gate coupled to the output end of the second operational amplifier, and a drain coupled to the second output end.

4. The driving apparatus according to claim 3, wherein the second driving unit further comprises:
   a second output resistor, coupled to the drain of the second transistor; and
   a switching unit, coupled between the second output resistor and the second bonding pad;
   wherein when the driving apparatus operates in the first transmission mode, the switching unit couples the second output resistor to an auxiliary resistor; and when the driving apparatus operates in the second transmission mode, the switching unit couples the second output resistor to the second bonding pad.

5. The driving apparatus according to claim 4, wherein a resistance of the auxiliary resistor is higher than that of the second output resistor.

6. The driving apparatus according to claim 1, wherein when the driving apparatus operates in the first transmission mode, the first signal is substantially equal to a first driving voltage output by the first output end.

7. The driving apparatus according to claim 6, wherein when the driving apparatus operates in the second transmission mode, the second signal is substantially equal to ½ of the first driving voltage.

8. The driving apparatus according to claim 1, wherein when the driving apparatus operates in the first transmission mode, the second driving unit is in a current mode; and when the driving apparatus operates in the second transmission mode, the second driving unit is in a voltage mode.

9. The driving apparatus according to claim 1, wherein when the driving apparatus operates in the second transmission mode, the first driving unit and the second driving unit are in a voltage mode.

10. The driving apparatus according to claim 1, wherein the first transmission mode is 10 Mbps transmission mode, and the second transmission mode is 1000 Mbps transmission mode.

11. A driving apparatus, for outputting a driving signal to a first bonding pad, the driving apparatus comprising:
    a first driving unit, having a first output end, and used for generating a first driving voltage to the first output end;
    a second driving unit, having a second output end coupled to the first bonding pad, and used for outputting a first driving current to the second output end; and
    a resistor, coupled between the first output end and the second output end;
    wherein when the driving apparatus operates in a first transmission mode, the second driving unit is used for assisting in driving the first bonding pad; and when the driving apparatus operates in a second transmission mode, the second driving unit is used for driving a second bonding pad.

12. The driving apparatus according to claim 11, wherein the first driving unit comprises:
    a first feedback resistor;
    a first operational amplifier, having at least an input end and an output end; and
    a first transistor, having a gate coupled to the output end of the first operational amplifier, and a drain coupled to the first output end and coupled to the input end of the first operational amplifier via the first feedback resistor.

13. The driving apparatus according to claim 12, wherein the second driving unit comprises:
    a second feedback resistor;
    a second operational amplifier, having at least an input end and an output end;
    a second transistor, having a gate coupled to the output end of the second operational amplifier, and a drain coupled to the input end of the second operational amplifier via the second feedback resistor; and
    a third transistor, having a gate coupled to the output end of the second operational amplifier, and a drain coupled to the second output end.

14. The driving apparatus according to claim 13, wherein the second driving unit further comprises:
    a second resistor, coupled to the drain of the second transistor; and
    a switching unit, coupled between the second resistor and a second bonding pad;

wherein when the driving apparatus operates in the first transmission mode, the switching unit couples the second resistor to an auxiliary resistor; and when the driving apparatus operates in the second transmission mode, the switching unit couples the second resistor to the second bonding pad.

15. The driving apparatus according to claim 11, wherein when the driving apparatus operates in the first transmission mode, a voltage value of the driving signal is substantially equal to the first driving voltage; and when the driving apparatus operates in the second transmission mode, the voltage value of the driving signal is substantially equal to ½ of the first driving voltage.

16. The driving apparatus according to claim 11, wherein when the driving apparatus operates in the first transmission mode, the second driving unit outputs the first driving current to the first bonding pad, such that the first driving current flows through the first bonding pad to output the driving signal; and when the driving apparatus operates in the second transmission mode, the second driving unit stops outputting the first driving current to the first bonding pad, such that the first driving voltage outputs the driving signal through the resistor.

17. The driving apparatus according to claim 11, wherein when the driving apparatus operates in the first transmission mode, the second driving unit drives the first bonding pad in a current mode; and when the driving apparatus operates in the second transmission mode, the first driving unit drives the first bonding pad in a voltage mode.

18. The driving apparatus according to claim 11, wherein the first transmission mode is 10 Mbps transmission mode, and the second transmission mode is 100 Mbps transmission mode or 1000 Mbps transmission mode.

19. A driving apparatus, for outputting a driving signal to a first bonding pad, the driving apparatus comprising:
   a first driving unit, having a first output end, and used for generating a first driving voltage to the first output end, wherein the first driving unit comprises:
   a first feedback resistor;
   a first operational amplifier, having at least an input end and an output end; and
   a first transistor, having a gate coupled to the output end of the first operational amplifier, and a drain coupled to the first output end and coupled to the input end of the first operational amplifier via the first feedback resistor;
   a second driving unit, having a second output end coupled to the first bonding pad, and used for outputting a first driving current to the second output end; and
   a resistor, coupled between the first output end and the second output end.

20. A driving apparatus of claim 19, wherein when the driving apparatus operates in a first transmission mode, the second driving unit outputs the first driving current to the first bonding pad, such that the first driving current flows through the first bonding pad to output the driving signal; and when the driving apparatus operates in a second transmission mode, the second driving unit stops outputting the first driving current to the first bonding pad, such that the first driving voltage outputs the driving signal through the resistor.

* * * * *